United States Patent
Ikegami et al.

(10) Patent No.: US 6,201,308 B1
(45) Date of Patent: Mar. 13, 2001

(54) SEMICONDUCTOR CHIP HAVING A LOW-NOISE GROUND LINE

(75) Inventors: Kayoko Ikegami; Takuya Hirota, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/153,384

(22) Filed: Sep. 15, 1998

(30) Foreign Application Priority Data

Sep. 16, 1997 (JP) .................................... 9-250433

(51) Int. Cl.[7] ......................... H01L 23/48; H01L 23/52; H01L 29/40
(52) U.S. Cl. ............................. 257/786; 257/691
(58) Field of Search ................................ 257/786, 691

(56) References Cited

U.S. PATENT DOCUMENTS 5,875,086 * 2/1999 Narita ..................................... 361/56

FOREIGN PATENT DOCUMENTS

| 61-268034 | 11/1986 | (JP) | ............................... H01L/21/66 |
| 2-211653 | 8/1990 | (JP) | ............................... H01L/21/82 |
| 2-254740 | 10/1990 | (JP) | ............................... H01L/21/82 |
| 7-297372 | 11/1995 | (JP) | ............................... H01L/27/04 |
| 9-199670 | 7/1997 | (JP) | ............................... H01L/27/04 |

* cited by examiner

*Primary Examiner*—Steven Loke
*Assistant Examiner*—Thien F. Tran
(74) *Attorney, Agent, or Firm*—Hayes, Soloway, Hennessey, Grossman & Hage, P.C.

(57) ABSTRACT

A semiconductor chip has a first ground line for maintaining a stable ground potential for the internal circuit. The first ground line is connected to a second ground line disposed on a scribe region of the semiconductor chip via a bonding pad, which is connected to an external lead frame. I/O circuit has a third ground line directly connected to the second ground line without passing the bonding pad. The noise propagated from the third ground line to the first ground line is reduced by passing the noise through the bonding pad.

2 Claims, 5 Drawing Sheets

SEMICONDUCTOR CHIP HAVING A LOW-NOISE GROUND LINE

BACKGROUND OF THE INVENTION (a) Field of the Invention

The present invention relates to a semiconductor device having a low-noise ground line and, more particularly, to a structure for reducing the noise propagating through the ground line in a semiconductor device.

(b) Description of the Related Art

A semiconductor device generally has a pair of source lines including a high voltage source line and a ground line for supplying electric power to the functional elements disposed therein. Referring to FIG. 1 which shows a schematic top plan view of a first conventional semiconductor chip, the semiconductor chip is implemented as a SRAM device and formed on a p-type silicon substrate. The semiconductor chip 10 has a scribe region 12 on the outer periphery of the chip 10, wherein a ground line 13 shown by hatching is disposed. In the internal area of the semiconductor chip 10, another ground line 14 shown also by hatching is disposed for supplying a ground potential to the functional elements in the internal area. Both the ground lines 13 and 14 are connected together through bonding pads 14A and 14B.

A high voltage source line 15 is disposed in the internal area for supplying a source potential to the internal circuit, and connected to an external lead frame (not shown) through bonding pads 15A and 15B disposed at the ends of the source line 15, by using a bonding technique. The ground lines 13 and 14 are also connected to the external lead frame through bonding pads 14A and 14B disposed at the ends of the ground lines 13 and 14, by using a bonding technique.

I/O circuit 16 is disposed as a part of the internal circuit adjacent to the scribe region 12 of the semiconductor chip 10. The I/O circuit 16 includes a plurality of output transistors 19A to 19F, which are connected to a common ground line 17 for the I/O circuit 16, source line 18 and corresponding signal lines not shown in the figure. The signal lines are connected to the external lead frame through bonding pads by a bonding technique for outputting corresponding signals from the output transistors. The ground line 17 and the source line 18 are connected to bonding pads 17A and 18A, respectively, which are connected to external lead frame for receiving the ground potential and the source potential.

With the recent increase in the operational speed of the semiconductor device, it has become difficult to obtain a stable operation of the semiconductor chip of FIG. 1 due to the adverse effect of the noise reflected during signal transmission from the output transistors. For reducing the adverse effect, it may be required that the ground line 17 disposed for the output transistors 19A to 19F have a larger width for suppressing the fluctuation of the ground potential on the ground line 17. However, the demand for reduction of the chip size for the semiconductor device in the recent years prevents a large width for the ground line 17, which leads an unstable operation of the semiconductor device.

Referring to FIG. 2 which shows a top plan view of a corner portion of a typical DRAM formed on an n-type semiconductor substrate as a second conventional semiconductor chip 20, a first stage circuit block 25 as a part of the internal circuit is disposed in vicinity of the outer periphery of the semiconductor chip, wherein ground lines 23 and 24 extend parallel to each other. FIG. 3 shows a circuit configuration for the input stage circuit block 25 shown in FIG. 2, wherein p-channel transistors Q1 and Q2 and an n-channel transistor Q3 are connected in series between a high voltage source line Vcc and the ground line. An address terminal connected to the gates of transistors Q2 and Q3 is connected to the bonding pad 27A through the electrostatic discharge element 26A as shown in FIG. 2. If another address terminal is disposed in the first stage circuit block 25, the another address terminal is similarly connected to the bonding pad 27B through the electrostatic discharge element 26B as shown in FIG. 2.

The bonding pads 27A and 27B are respectively connected to the external lead frame by a bonding technique for connecting the address terminals to the external lead frame. The electrostatic discharge elements 26A and 26B are connected to the ground line 24 for protecting the semiconductor device against destruction of the transistors caused by the electrostatic discharge failure. The ground line 23 disposed on the scribe region 22 is connected to the ground line 24 through a bonding pad 24A, which is connected to the external lead frame by a bonding technique. In FIG. 2, the recent increase in the operational speed of the semiconductor device also causes the ground potential of the ground line 24 to fluctuate due to the noise on the ground line 24.

SUMMARY OF THE INVENTION

In view of the above, it is an object of the present invention to provide a semiconductor device wherein fluctuation of the ground potential and/or the source potential of the semiconductor device can be suppressed.

The present invention provides, in a first aspect thereof, a semiconductor chip comprising a semiconductor substrate including an internal circuit region and a scribe region encircling the internal circuit region, the internal circuit region receiving therein an internal circuit and an I/O circuit for inputting an external signal to supply an internal signal to the internal circuit, a first source line disposed in the internal circuit region for applying a first potential to the internal circuit, a second source line formed on the scribe region and connected to the first source line via a bonding pad for applying the first potential to the semiconductor substrate, and a third source line connected to the second source line without passing the bonding pad for applying the first potential to the I/O circuit.

The present invention provides, in a second aspect thereof, a semiconductor chip comprising a semiconductor substrate including an internal circuit region and a scribe region encircling the internal circuit region, the internal circuit region receiving therein an internal circuit and an I/O circuit for inputting an external signal to supply an internal signal to the internal circuit, a first source line disposed in the internal circuit region for applying a first potential to the internal circuit, a second source line formed on the scribe region and connected to the first source line via a bonding pad for applying the first potential to the semiconductor substrate, the first source line having a first portion directly connected to the I/O circuit and to a second portion of the second source line without passing the bonding pad.

In accordance with the semiconductor devices of the present invention, a ground line or high voltage source line disposed for the internal circuit as one of the source lines is less susceptible to noise generated by the I/O circuit, whereby a stable operation of the semiconductor chip can be obtained.

The above and other objects, features and advantages of the present invention will be more apparent from the following description, referring to the accompanying drawings.

PREFERRED EMBODIMENTS OF THE INVENTION

Figure 1:
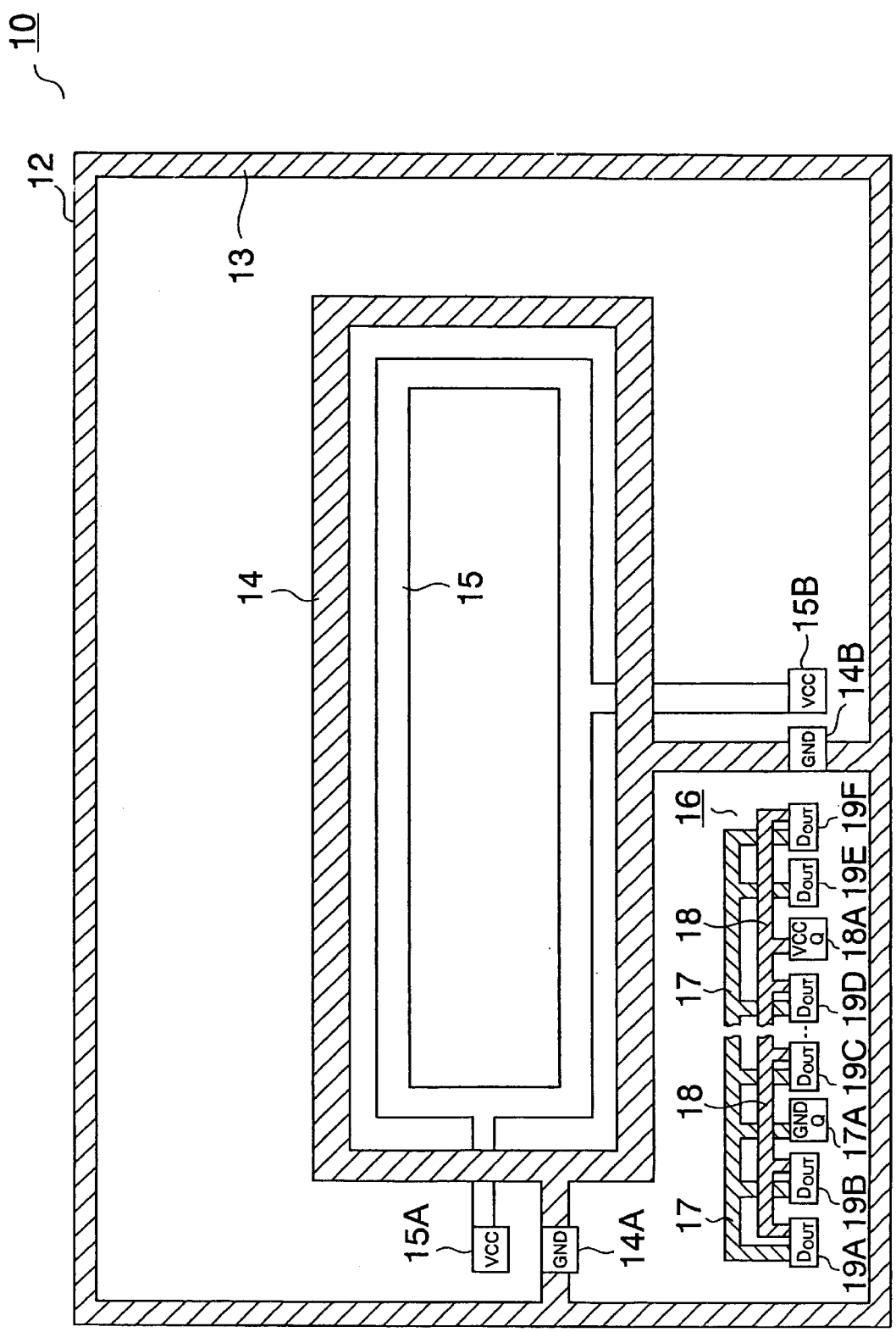
FIG. 1 is a top plan view of a first conventional semiconductor chip.
Figure 2:
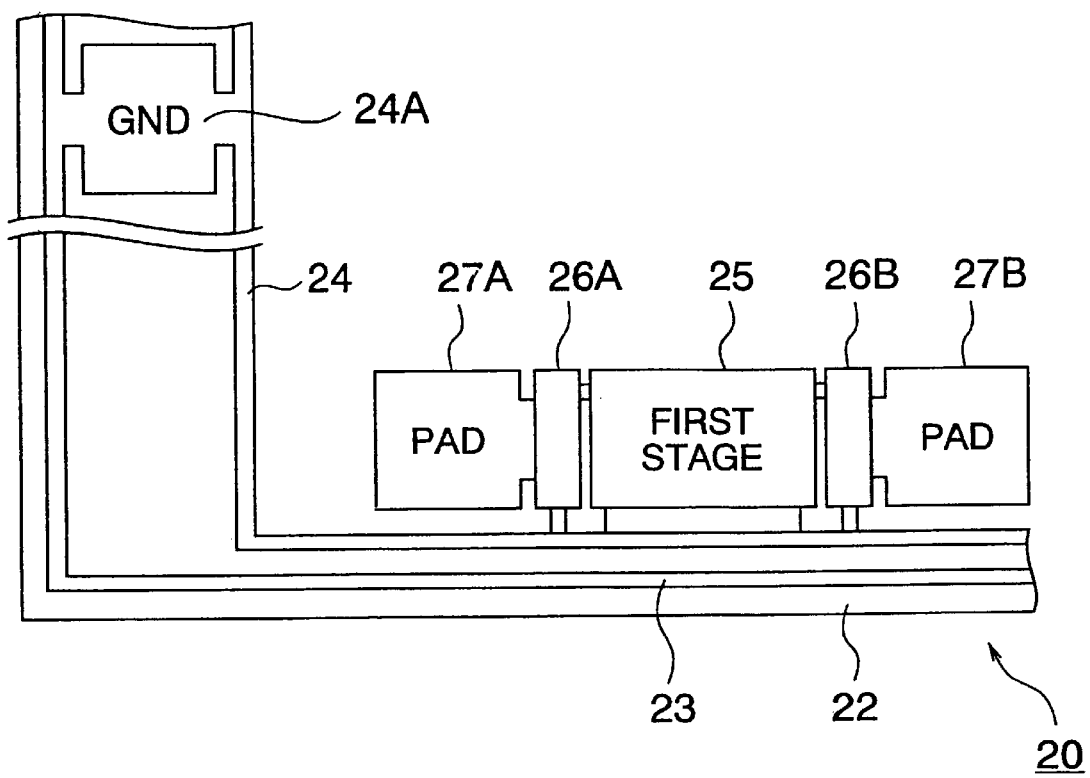
FIG. 2 is a partial top plan view of a second conventional semiconductor chip.

Now, the present invention is more specifically described with reference to accompanying drawings, wherein similar constituent elements are designated by similar reference numerals or related reference numerals throughout the drawings.

Figure 4:
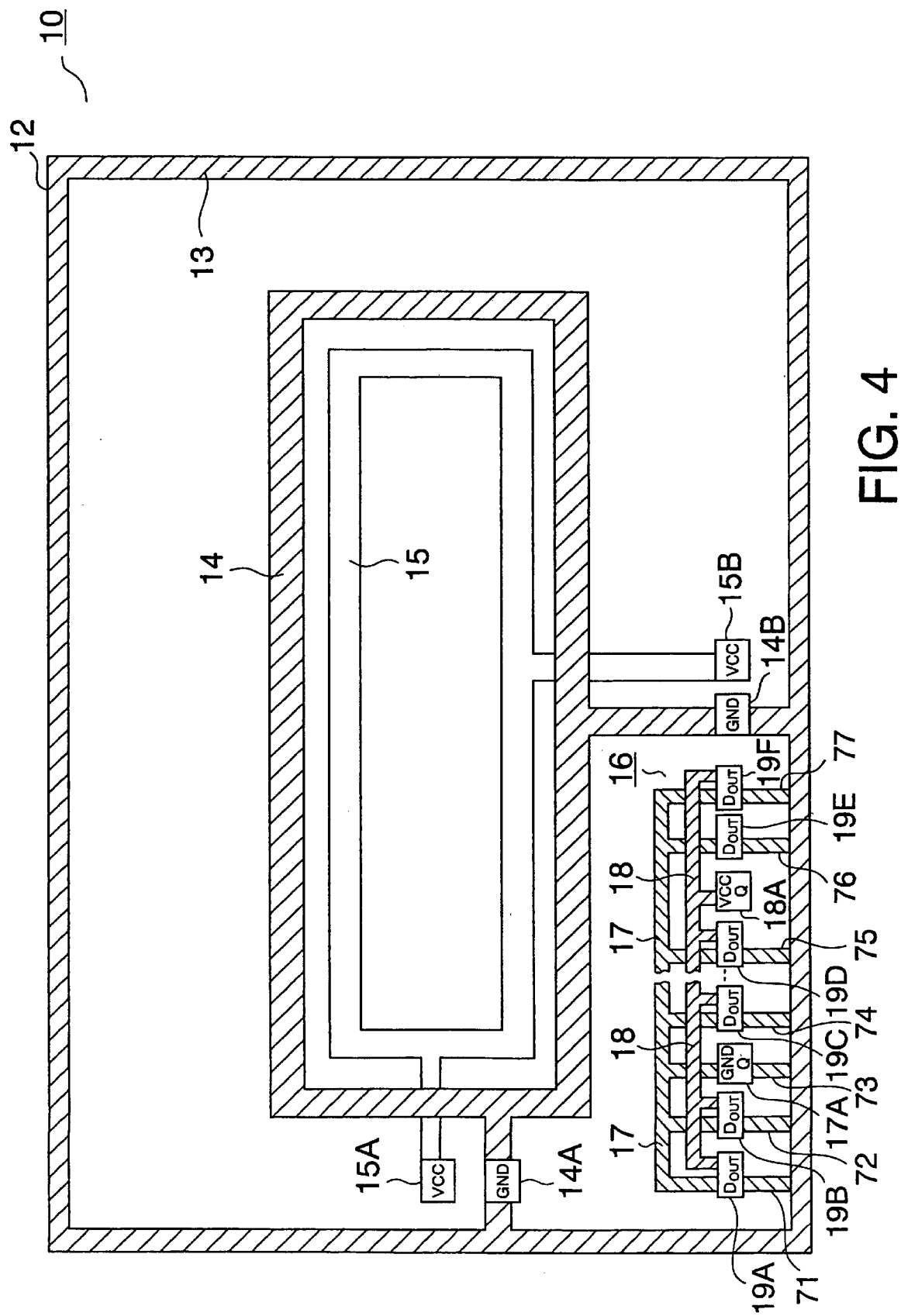
FIG. 4 is a top plan view a semiconductor chip according to a first embodiment of the present invention.

Referring to FIG. 4, a semiconductor chip according to a first embodiment of the present invention is implemented as a SRAM device formed on a p-type silicon substrate. The semiconductor chip 10 has on the outer periphery of the semiconductor chip 10 a scribe region 12, whereon a first ground line 13 shown by hatching is disposed. The scribe region 12 is generally used for dicing a semiconductor wafer to separate the semiconductor chip 10 from other semiconductor chips. The semiconductor chip also has an internal circuit region encircled by the scribe region 12, and a second ground line 14 shown by hatching and disposed for supplying a ground potential to the functional elements in the internal circuit region. Both the first and second ground lines 13 and 14 are connected together through bonding pads 14A and 14B to implement one of a pair of source lines.

A high-voltage source line 15 as the other of source lines is disposed in the internal circuit region for supplying a high voltage potential to the internal circuit, and connected to an external lead frame (not shown) through bonding pads 15A and 15B disposed at the respective ends of the high voltage source line 15, by using a bonding technique. The ground lines 13 and 14 are also connected to the external lead frame through the bonding pads 14A and 14B disposed at the ends of both the ground lines 13 and 14, by using a bonding technique.

An I/O circuit 16 including a plurality of output transistors 19A to 19F is installed adjacent to the scribe region 12, wherein each transistor in the I/O circuit 16 is connected to a third ground line 17, a high voltage source line 18 and corresponding signal lines (not shown). The signal lines are connected to the external lead frame through respective bonding pads by a bonding technique for outputting corresponding signals from the output transistors 19A to 19F. The third ground line 17 and the high voltage source line 18 are connected to bonding pads 17A and 18A, respectively, which are connected to the external lead frame for receiving the ground potential and the source potential, respectively.

The third ground line 17 disposed for the I/O circuit 16 and connected to each output transistor is directly connected to the first ground line 13 through wires 71 to 77 disposed for respective output transistors 19A to 19F, without passing the bonding pads 14A and 14B. The direct connections of the third ground line 17 to the second ground line 13 on the scribe region 12 allow the improvement of the function of the third ground line 17 for maintaining a stable ground potential of the I/O circuit 16. In this configuration, noise generated on the third ground line 17 by the I/O circuit 16 is not directly transferred to the second ground line 14 for the internal circuit, whereby the magnitude of the noise transferred from the third ground line 17 to the first ground line 14 is reduced by the bonding pads 14A and 14B connected to the external lead frame.

Figure 5:
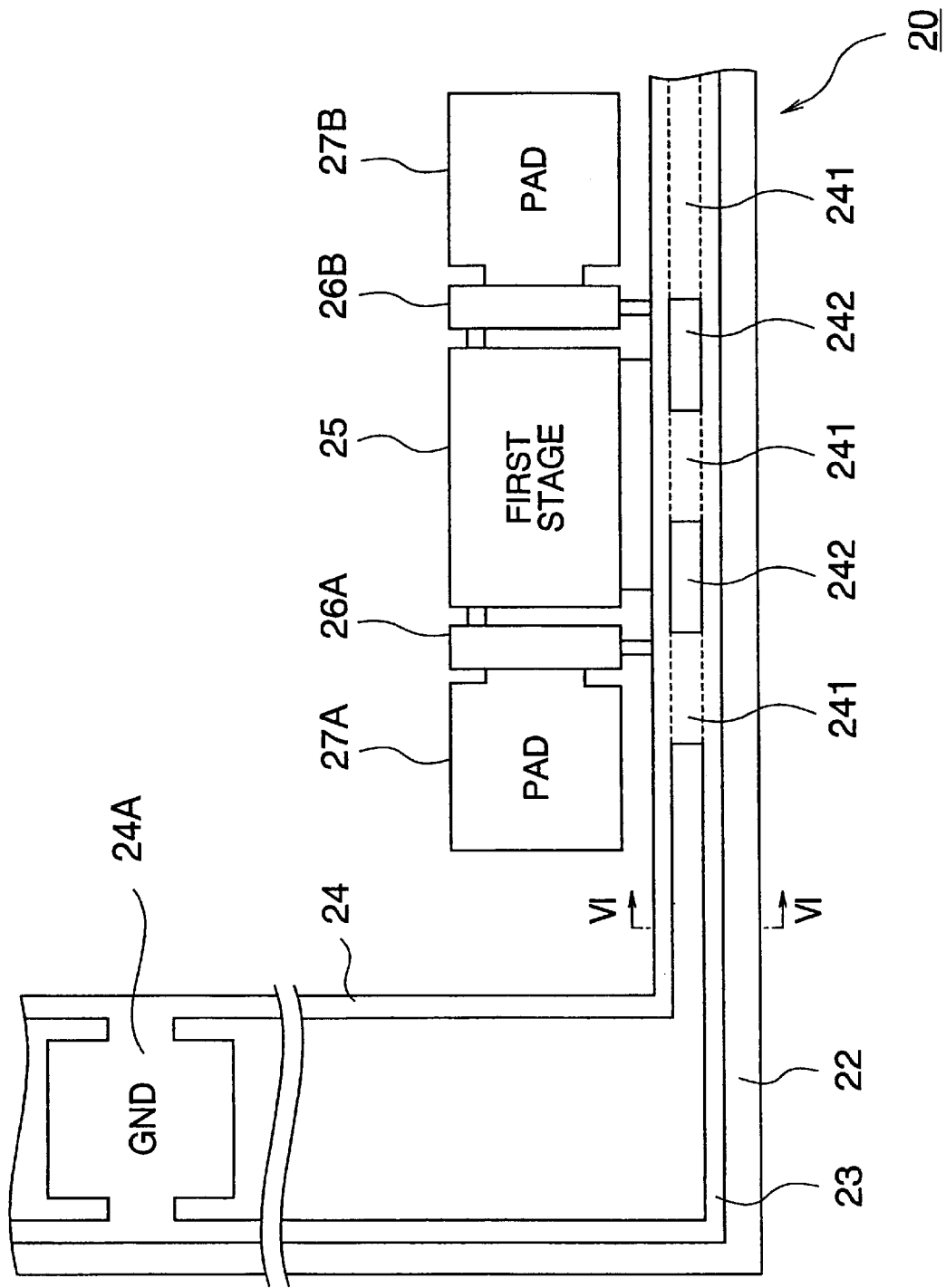
FIG. 5 is a partial top plan view of a semiconductor chip according to a second embodiment of the present invention.

Referring to FIG. 5, a semiconductor chip according to a second embodiment of the present invention is shown in a partial top plan view thereof. In the illustrated configuration, a first ground line 23 is disposed on the scribe region 22 for applying a ground potential to the semiconductor substrate. Adjacent to the first ground line 23, a second ground line 24 extends parallel to the first ground line 23 and is connected to the first ground line 23 via a bonding pad 24A, which is in turn connected to an external lead frame.

Figure 3:
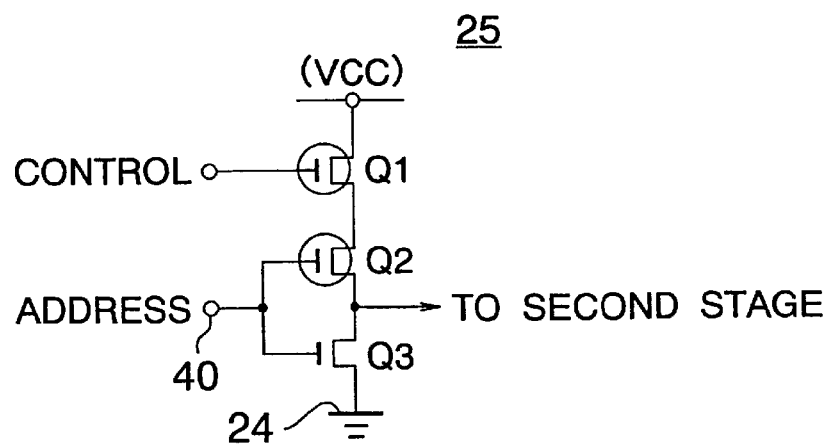
FIG. 3 is a circuit diagram of the first stage circuit block shown in FIG. 2.

An I/O circuit including a first stage circuit block 25 for receiving an external signal is disposed adjacent to the second ground line 24. The first stage circuit block 25 has a circuit configuration shown in FIG. 3, wherein the source of the n-channel transistor Q3 is electrically connected to the second ground line 24. The address terminal 40 of the first stage circuit block 25 is connected a bonding pad 27A through an electrostatic discharge element 26A. Another address terminal of the first stage circuit block 25, if any, is also connected to a bonding pad 27B through another electrostatic discharge element 26B. The bonding pads 27A and 27B are respectively connected to the external lead frame by a bonding technique. The electrostatic discharge elements 26A and 26B are connected to the second ground line 24 for discharging the electrostatic charge entering to the semiconductor chip 20 through the address terminal 40, thereby protecting the semiconductor chip 20 against an electrostatic discharge failure.

In the present embodiment, the second ground line 24 disposed for the first stage circuit block 25 and the first ground line 23 disposed on the scribe region 22 are formed as a single line in the region adjacent to the first stage circuit block 25 by interposing therebetween a plurality of line segments 241 so that a plurality of slits or apertures 242 are formed between each adjacent two of the line segments 241. The connection of the first ground line 13 and the second ground line 14 in this configuration also allows a stable ground potential of the second ground line 24 for the internal circuit even in the case of a higher operational speed of the semiconductor device.

In some instances, a dicing operation of the semiconductor wafer into a plurality of chips along the scribe region 22 involves a crack in the first ground line 23 formed on the scribe region 22 due to the stress caused by the dicing. The slits 242 formed between the first ground line 23 and the second ground line 24 according to the present embodiment prevent the crack generated on the first ground line 23 from extending toward the second ground line 24 for the first stage circuit block 25 of the internal circuit block. Exemplified dimensions of the ground lines are such that: the distance between the slits 242 is 100 $\mu$m, the length and width of the slits 242 are 100 $\mu$m and 7 $\mu$m, respectively, the widths of the first and second ground lines 23 and 24 are 10 $\mu$m and 5 $\mu$m, respectively.

Figure 6:
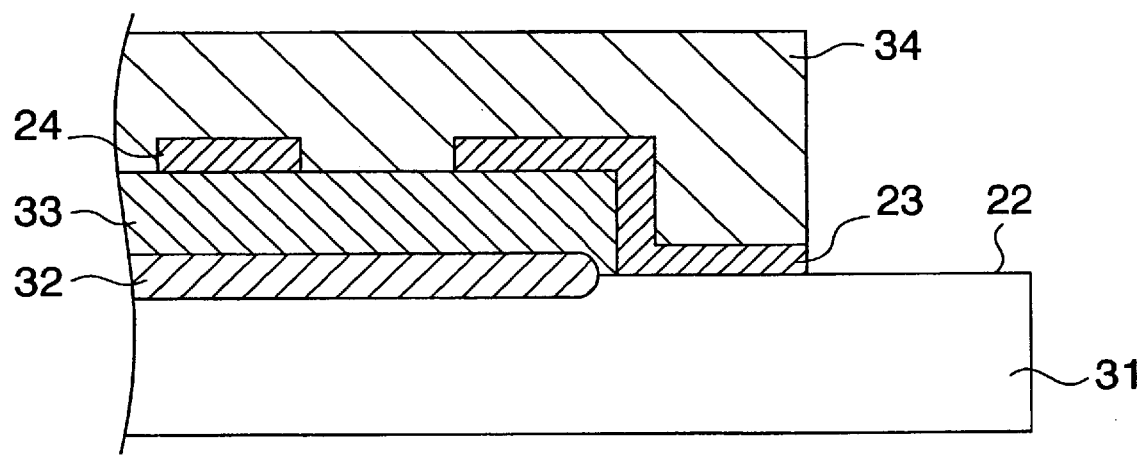
FIG. 6 is a sectional view of the semiconductor chip of FIG. 5 taken along line VI—VI in FIG. 5.

Referring to FIG. 6, there is shown a cross-sectional view of the semiconductor chip 20 taken along line VI—VI in FIG. 5. The semiconductor chip 20 is formed by the steps including forming a field oxide film 32 on a p-type semiconductor substrate 31, forming an interlayer dielectric film 33 thereon, forming the second ground line 24 for the first stage circuit block as well as the first ground line 23 on the dielectric film 33 and the scribe region 22 of the semiconductor substrate 31, and forming a cover film made of SiON on the preceding films.

The first ground line 23 on the scribe region 22 functions for applying a ground potential to the semiconductor substrate 31. If the semiconductor substrate 31 is of n-type, the first ground line 23 is replaced by a high voltage source line formed on the scribe region 22 and connected to an external source line Vcc and the drain of the p-channel transistor Q1 shown in FIG. 3. In this case, the high voltage source line has a stable source potential according to the present invention.

Since the above embodiments are described only for examples, the present invention is not limited to the above embodiments and various modifications or alterations can be easily made therefrom by those skilled in the art without departing from the scope of the present invention.

What is claimed is:

1. A semiconductor chip comprising a semiconductor substrate including an internal circuit region and a scribe region encircling said internal circuit region, said internal circuit region receiving therein an internal circuit and an I/O circuit for inputting an external signal to supply an internal signal to said internal circuit, a first source line disposed in said internal circuit region for applying a first potential to said internal circuit, a second source line formed on said scribe region and connected to said first source line via a bonding pad for applying said first potential to said semiconductor substrate, a third source line connected to said second source line without passing said bonding pad for applying said first potential to said I/O circuit, and a plurality of fourth source lines directly connected to said second source line, wherein said I/O circuit includes a plurality of transistors each connected to a corresponding one of said fourth source lines.

2. A semiconductor chip as defined in claim 1, wherein said bonding pad is connected to an external lead frame.

* * * * *

UNITED STATES PATENT AND TRADEMARK OFFICE
CERTIFICATE OF CORRECTION

PATENT NO. : 6,201,308 B1
DATED : March 13, 2001
INVENTOR(S) : Ikegami et al.

It is certified that error appears in the above-identified patent and that said Letters Patent is hereby corrected as shown below:

Column 3,
Line 67, "second" should be -- first --

Column 4,
Line 7, "first" should be -- second --

Signed and Sealed this

Twenty-seventh Day of August, 2002

Attest:

Attesting Officer

JAMES E. ROGAN
Director of the United States Patent and Trademark Office